US006727008B1

(12) United States Patent
Antoniadis et al.

(10) Patent No.: US 6,727,008 B1
(45) Date of Patent: Apr. 27, 2004

(54) OXADIAZOLE BLUE-EMITTING ORGANIC LED'S

(75) Inventors: Homer Antoniadis, Mountain View, CA (US); Michael Inbasekaran, Midland, MI (US); Edmund P. Woo, Midland, MI (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 08/847,138

(22) Filed: Apr. 30, 1997

(51) Int. Cl.$^7$ .............................................. H05B 33/14
(52) U.S. Cl. ....................... 428/690; 428/917; 313/504; 313/506
(58) Field of Search ................................ 428/690, 704, 428/917; 313/504, 506

(56) References Cited

U.S. PATENT DOCUMENTS

| | | | | | |
|---|---|---|---|---|---|
| 5,281,489 A | * | 1/1994 | Mori et al. | .................. | 428/690 |
| 5,336,546 A | * | 8/1994 | Hironaka et al. | ........... | 428/209 |
| 5,343,050 A | * | 8/1994 | Egusa et al. | .................... | 257/40 |
| 5,382,477 A | * | 1/1995 | Saito et al. | .................... | 428/690 |
| 5,420,288 A | * | 5/1995 | Ohta et al. | .................... | 548/145 |
| 5,449,564 A |  | 9/1995 | Nishio et al. | ............... | 428/690 |
| 5,457,565 A |  | 10/1995 | Namiki et al. | .............. | 359/273 |
| 5,610,309 A |  | 3/1997 | Ohta et al. | ................... | 546/256 |
| 5,652,067 A | * | 7/1997 | Ito et al. | ....................... | 428/690 |
| 5,932,363 A | * | 8/1999 | Hu et al. | ....................... | 428/690 |
| 5,955,209 A | * | 9/1999 | Murata et al. | ............... | 428/690 |
| 5,981,092 A | * | 11/1999 | Arai et al. | ................... | 428/690 |

FOREIGN PATENT DOCUMENTS

| | | |
|---|---|---|
| EP | 0278758 A | 8/1988 |
| EP | 0508562 A | 10/1992 |
| EP | 0622975 A | 11/1994 |
| JP | 11-185960 | * 7/1999 |
| WO | WO 97 33193 A | 9/1997 |

OTHER PUBLICATIONS

Yuji Hamada et al., "Blue–Light–Emitting Organic ELectroluminescent Devices with Oxadiazole Dimer Dyes as an Emitter", Japanese Journal of Applied Physics, vol. 31, No. 6A, Jun. 31, 1992, pp. 1812–1816.

* cited by examiner

Primary Examiner—Marie Yamnitzky

(57) ABSTRACT

An organic OLED having a cathode formed from a first conducting layer, an electroluminescent layer including an oxadiazole compound, and an anode constructed from a second conducting layer which is transparent to light generated by the electroluminescent layer. In one embodiment, an electron transport layer is sandwiched between the anode and electroluminescent layers. Other embodiments utilize a hole transport layer between the electroluminescent layer and the anode either with or without the electron transport layer. In one embodiment, the anode is constructed from a layer of indium tin oxide and a layer of a hole transport material that bonds to indium tin oxide and which has an energy band intermediate between that of indium tin oxide and that of the hole transport layer.

28 Claims, 4 Drawing Sheets

OXADIAZOLE BLUE-EMITTING ORGANIC LED'S

FIELD OF THE INVENTION

The present invention relates to electroluminescent devices, and more particularly, to light-emitting devices based on small organic molecules.

BACKGROUND OF THE INVENTION

Organic light-emitting diodes (OLED's) have the potential for providing inexpensive alternatives to LED's. OLED's may be fabricated by coating the appropriate surfaces with the organic material either from solution or by using conventional vacuum deposition techniques, and hence, do not require the use of high cost fabrication systems such as those utilized in the fabrication of semiconductor devices. A simple OLED may be constructed from an electroluminescent layer sandwiched between an electron injection electrode and a hole injection electrode. More complicated devices utilize electron and hole transport layers between the above mentioned electrodes and the electroluminescent layer.

Addressable color displays may be constructed from OLED's if individual OLED's having three primary colors can be constructed. However, compounds having a common chemical structure that can be modified with a dye to provide the primary colors and which have sufficient quantum efficiency at low operating voltages have been lacking.

Broadly, it is the object of the present invention to provide an improved OLED.

It is a further object of the present invention to provide a set of OLED's that can be utilized in constructing a color display.

It is a still further object of the present invention to provide an OLED that has higher quantum efficiency at low operating voltages than prior art OLED's.

These and other objects of the present invention will become apparent to those skilled in the art from the following detailed description of the invention and the accompanying drawings.

SUMMARY OF THE INVENTION

The present invention is an organic LED having a cathode formed from a first conducting layer, an electroluminescent layer including an oxadiazole, thiadiazole or triazole compound, and an anode constructed from a second conducting layer which is transparent to light generated by the electroluminescent layer. In one embodiment, an electron transport layer is sandwiched between the anode and electroluminescent layers. Other embodiments utilize a hole transport layer between the electroluminescent layer and the anode either with or without the electron transport layer. In one embodiment, the anode is constructed from a layer of indium tin oxide and a layer of a hole transport material that bonds to indium tin oxide and which has an energy band intermediate between that of indium tin oxide and that of the hole transport layer.

DETAILED DESCRIPTION OF THE INVENTION

Figure 1:
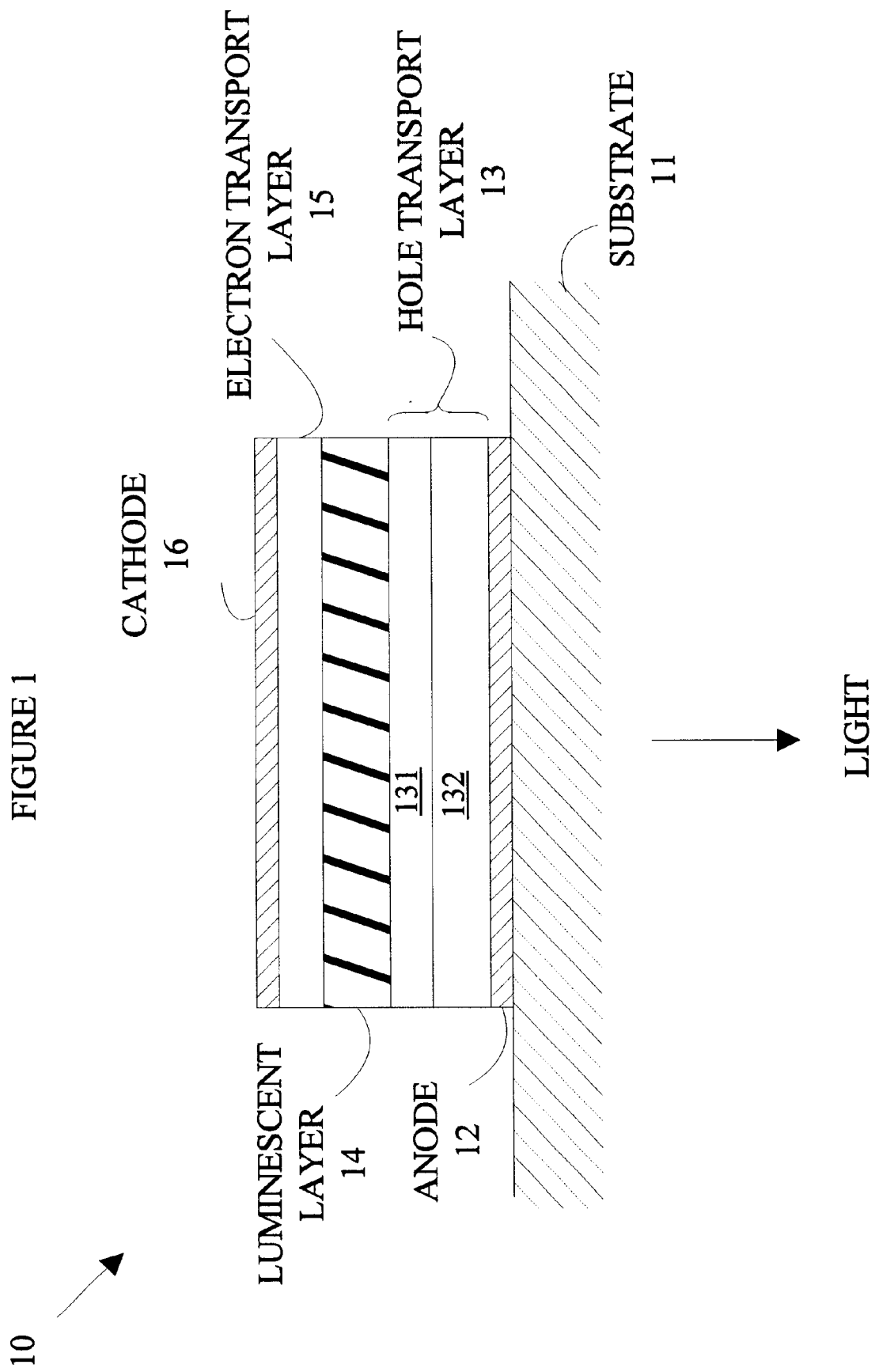
FIG. 1 is a cross-sectional view of an LED according to the present invention.

The present invention may be more easily understood with reference to FIG. 1 which is a cross-sectional view of a OLED 10 according to the present invention. OLED 10 is typically constructed on a transparent substrate 11. A transparent anode 12 is deposited on substrate 11. Anode 12 provides a source of holes that combine with electrons injected via cathode 16 in luminescent layer 14 to generate light. To facilitate the injection of the electrons into luminescent layer 14, an optional electron transport layer 15 is utilized in some of the embodiments discussed below. Similarly, to facilitate the injection of holes into luminescent layer 14, an optional hole transport layer 13 is included between anode 12 and luminescent layer 14 in some of the embodiments discussed below. The various layers may be deposited by any of a number of conventional techniques such as spin casting, vapor deposition, etc.

Figure 2:
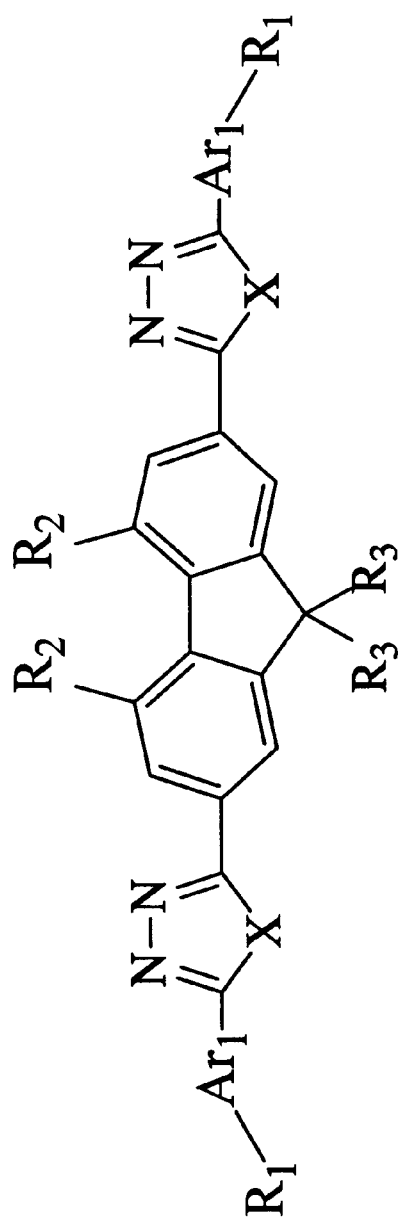
FIGS. 2–3 are the chemical formulae of compounds that may be used for the electroluminescent layer of the present invention.

The present invention is based on a luminescent layer comprising the oxadiazole, thiadiazole or triazole compositions shown in FIG. 2. Luminescent layer 14 is typically 100 to 1000 Å. In the heterocyclic compound shown in FIG. 2, X is independently in each occurrence —O—, —S—, or $N(R_5)$. Here, $R_5$ is a $C_{1-20}$ hydrocarbyl (which corresponds to the heterocyclic group being a 1,3,4 oxadiazole, 1,3,4-thiadiazole or 1,2,4-triazole, respectively). $R_1$ is, independently in each occurrence, a $C_{1-20}$ alkyl, alkoxy, aryl, aryloxy, or a tertiary amine group —$N(R_4)_2$, wherein $R_4$ is a $C_{1-20}$ hydrocarbyl group which is optionally substituted with $C_{1-20}$ alkoxy groups. $R_2$ is, independently in each occurrence, H or a $C_{1-20}$ hydrocarbyl group optionally containing one or more —O—, S—, or —$N(R_6)$— groups, wherein $R_6$ is H or $C_{1-10}$ hydrocarbyl. $R_3$ is, independently in each occurrence, a $C_{1-20}$ hydrocarbyl group, optionally containing one or more —O—, S—, or —$N(R_6)$— groups; and $Ar_1$ is independently in each occurrence a divalent $C_{5-10}$ aromatic group.

The heterocyclic groups are preferably oxadiazole or triazole and are most preferably oxadiazoles. Each $R_1$ is preferably a dimethylamino or diphenylamino group. $R_2$ and $R_3$ may contain a heteroatom such as O or S, or a group of the formula: —$NR_4$, wherein $R_4$ is H or $C_{1-10}$ hydrocarbyl. Preferably, $R_2$ and $R_3$ do not contain a hydrogen atom which is active according to the Zerewitnoff test described by Kohler in *Jour. Amer. Chem. Soc.*, Vol. 49, p. 3181 (1927). Examples of suitable $R_2$ groups include H and $C_{1-20}$ alkyl, alkoxy, aryl, aryloxy, alkoxyaryl, and alkylcarbonyloxy groups. $R_2$ is preferably H. Examples of suitable $R_3$ groups include $C_{1-20}$ alkyl, alkoxy, aryl, aryloxy, alkoxylaryl, and alkylcarbonioxy groups. Each $R_3$ is preferably selected from the group consisting of 2-ethylhexyl, n-octyl, and 4methoxyphenyl. Examples of suitable $Ar_1$ groups include 1,4-phenylene, 1,3-phenylene, 2,6-naphthylene, 1,4-naphthylene, 4,4'-biphenylene, 3,5-oxazolyl, 2,5-oxadiazolyl, 2,5-triazolyl, etc. $Ar_1$ is preferably a phenylene or naphthylene group, and is most preferably a 1,4- or 1,3-phenylene group.

The compounds of the present invention may be prepared by any suitable method. An example of such a method for the preparation of oxadiazole-containing compounds is by cyclization of the corresponding fluorene-containing bis-hydrazide. Methods for the cyclization of hydrazide-containing compounds are illustrated by Hayes et al. in *J. Am. Chem. Soc.*, Vol. 77, p.1850 (1955) and by Hetzheim and Mockel, chapter on "Recent Advances in 1,3,4-Oxadiazole Chemistry" in *Advances in Heterocyclic Chemistry*, Vol. 7, pp. 183–224 (1966).

Triazole-containing compounds may be prepared by reacting imidoyl chlorides with an aromatic amine, as illustrated by E. Klingsberg in *J. Am. Chem. Soc.*, Vol. 80, pp.5786–5789 (1958). Imidoyl chlorides may be prepared by reacting bis-hydrazides with $PCl_5$. Thiadiazole-containing compounds may be prepared by reacting bis-hydrazides with phosphorous pentasulfide, as illustrated in Advances in *Heterocyclic Chemistry*, Vol. 9, p. 169 (1968).

Bis-hydrazides may be prepared by reacting a fluorene-containing diacid chloride with two or more equivalents of a substituted aromatic hydrazide in a dipolar, aprotic solvent such as N-methylpyrrolidone (NMP) in the presence of a base such as pyridine or triethylamine, as illustrated by F. N. Hayes et al. in *J. Am. Chem. Soc.*, Vol. 77, pp.1850–1852 (1955). Alternatively, the reaction may also be carried out in the absence of the base wherein the solvent, NMP in particular, acts also as the base to scavenge the hydrogen halide produced in the reaction, as illustrated by A. H. Frazer and F. T. Wallenberger in *Journal of Polymer Science*: Part A, Vol. 2, pp. 1137–1145 (1964).

The fluorene-containing diacid chloride may be prepared from the corresponding diacid by any suitable technique such as, for example, reacting the diacid with thionyl chloride, oxalyl chloride, or phosgene. The fluorene-containing diacid may be prepared by reacting a dihalofluorene compound with magnesium to form a di-Grignard intermediate, which is then treated with excess $CO_2$ to form the desired diacid (methods for the preparation of dicarboxylic acids from haloaromatic compounds are illustrated by Gilman et al. in *Organic Synthesis, Collective*, Vol. 2, pp. 425 (1949)).

Figure 3:
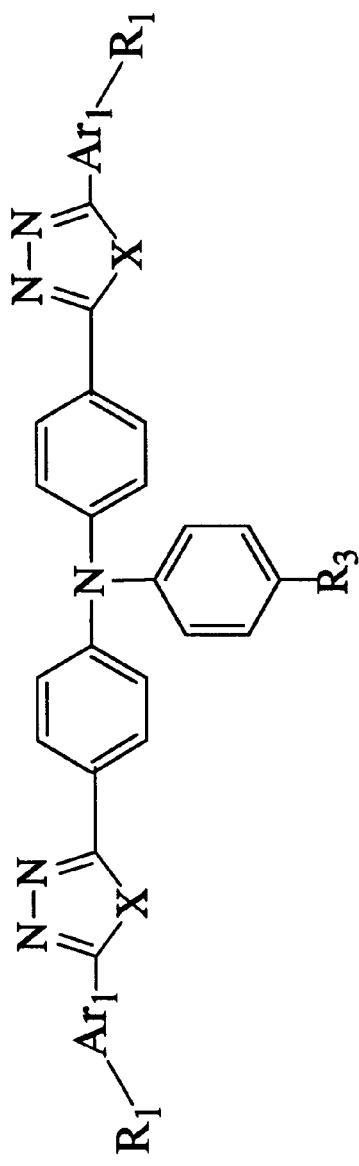

In the preferred embodiment of the present invention, luminescent layer 14 may also be constructed from luminescent layer comprising of a heterocyclic compound having the composition shown in FIG. 3. In this compound, X, $R_1$, $R_3$ and $Ar_1$ are the groups described earlier for the compound shown in FIG. 2.

In the preferred embodiment of the present invention, anode 12 is preferably constructed from transparent conducting film with a work function between 4.5 and 5.5 eV. Examples are indium tin oxide and gold. The cathode is preferably constructed from a conducting metal with a work function between 2.5 and 4.5 eV. Examples are lithium, calcium, magnesium, indium silver, aluminum or alloys of the above.

Figure 4:
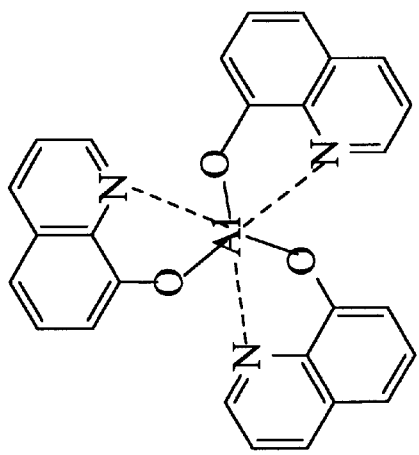
FIG. 4 is the chemical formula of a compound that may be used for the electron transport layer of the present invention.

If cathode 16 is constructed from Ca, the device will generate light in the blue region of the spectrum but with low quantum efficiency. However, a less reactive cathode material is preferred. For example, cathode 16 may be constructed from an alloy of Mg/Al, Mg/Ag or Li/Al however without improvement in device efficiency. An electron transport layer such as layer 15 is preferably used to improve the efficiency of electron injection into luminescent layer 14. Electron transport layer 15 can be constructed from any compound having an energy band intermediate between that of cathode 16 and luminescent layer 14. In the preferred embodiment of the present invention, electron transport layer 15 comprises a layer of a metal chelated oxinoid compound and most preferably of tris(8-quinoline) Aluminum($Alq_3$) whose formula is shown in FIG. 4. The thickness of electron transport layer 15 is typically between 50 and 1000 Å.

Figure 6:
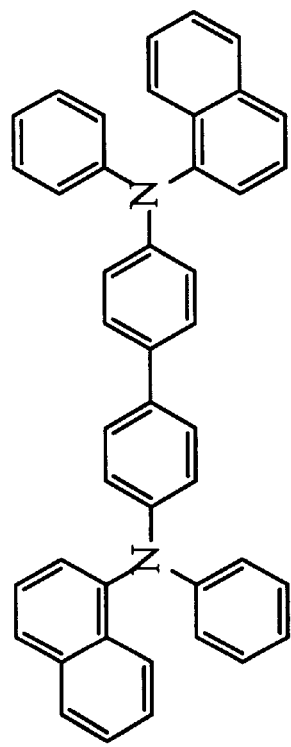
FIGS. 5–6 are the chemical formulae of compounds that may be used for the hole transport layer of the present invention.
Figure 5:
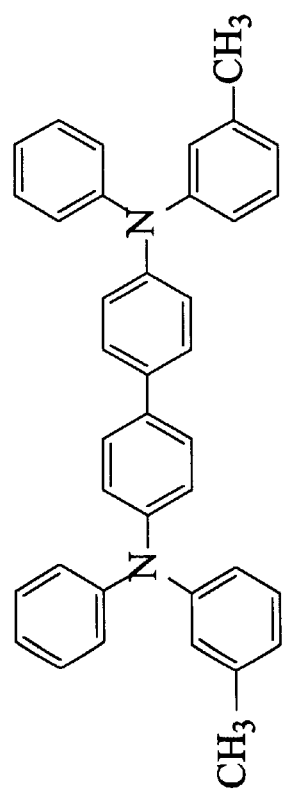

Similarly, the hole transport layer matches luminescent layer 14 to anode 12. When anode 12 is constructed from indium tin oxide, the hole transport layer is preferably constructed from two layers. Layer 131 improves the efficiency of hole injection into luminescent layer 14 by providing a material that has an energy band between those of anode 12 and luminescent layer 14. In the preferred embodiment of the present invention, layer 131 comprises an aromatic tertiary amine and most preferably of (N,N'-diphenyl-N,N'-bis-(3-methylphenyl)-{1,1'-biphenyl}-4,4'-diamine) (TPD) or 4,4'-Bis[N-(1-naphthyl)-N-phenylamino]-biphenyl (NPD) whose formula is shown in FIGS. 5 and 6 respectively.

Figure 8:
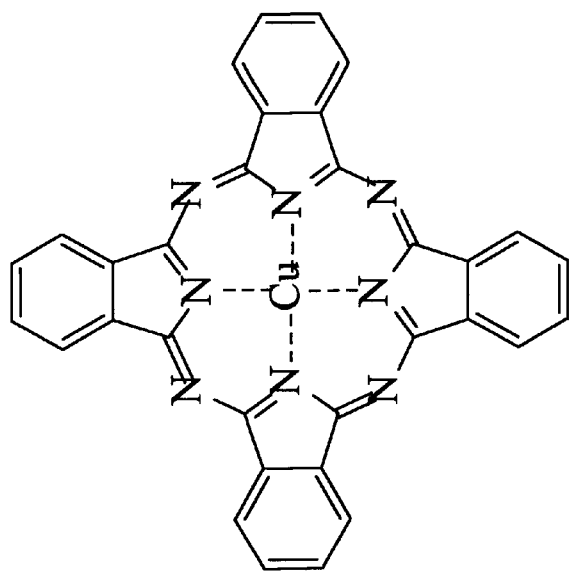
FIGS. 7–8 are the chemical formulae of compounds that may be used between the hole transport layer and an anode constructed from indium tin oxide.
Figure 7:
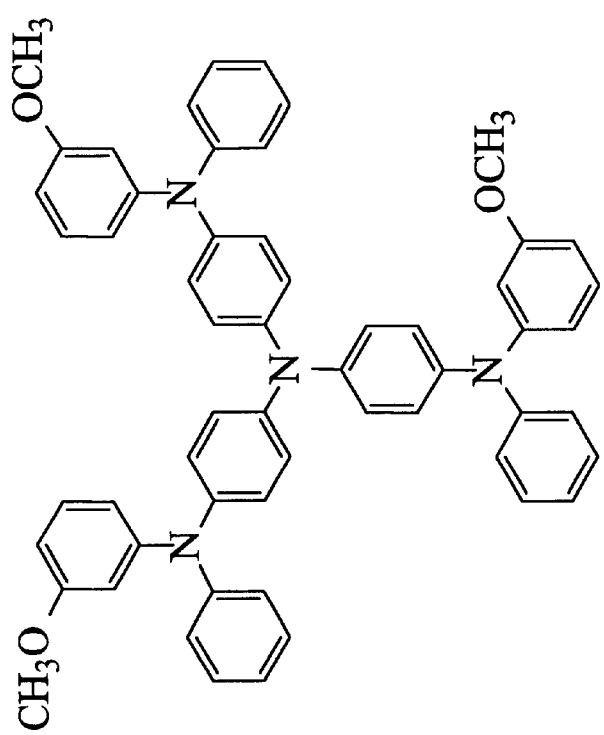

The second layer provides a physical interface between layer 131 and anode 12. It is found experimentally that compounds such as TPD do not bond well to indium tin oxide. Hence, an interface layer 132 which bonds well to indium tin oxide and has an ionization potential between that of indium tin oxide and layer 131 is utilized. In the preferred embodiment of the present invention, layer 132 is constructed from star-burst amines and most preferably from 4,4'4"-tris[N-(3-methoxyphenyl-N-phenylamino] triphenylamine (3MeODATA) whose chemical formula is shown in FIG. 7. Alternatively layer 132 is constructed from porphyrinic compounds and more preferably from copper phthalocyanine whose chemical formula is shown in FIG. 8. In general, layer 131 may be viewed as being part of the anode.

Various modifications to the present invention will become apparent to those skilled in the art from the foregoing description and accompanying drawings. Accordingly, the present invention is to be limited solely by the scope of the following claims.

What is claimed is:

1. An OLED comprising a cathode comprising a first conducting layer;

an electroluminescent layer comprising a compound having the formula

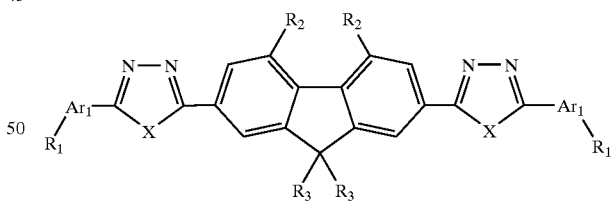

wherein X is independently in each occurrence —O—, —S—, or $N(R_5)$, wherein $R_5$ is a $C_{1-20}$ hydrocarbyl (which correspond to the heterocyclic group being a 1,3,4 oxadiazole, 1,3,4-thiadiazole or 1,2,4,-triazole, respectively); $R_1$ is independently in each occurrence $C_{1-20}$ alkyl, alkoxy, aryl, aryloxy, or a tertiary amine group —$N(R_4)_2$, wherein $R_4$ is a $C_{1-20}$ hydrocarbyl group which is optionally substituted with $C_{1-20}$ alkoxy groups; $R_2$ is independently in each occurrence H or a $C_{1-20}$ hydrocarbyl group optionally containing one or more —O—, S—, or —$N(R_6)$— groups, wherein $R_6$ is H or $C_{1-10}$ hydrocarbyl; $R_3$ is independently in each occurrence a $C_{1-20}$ hydrocarbyl group, optionally containing one or more —O—, S—, or —N(R$_6$)— groups; and Ar$_1$ is independently in each occurrence a divalent C$_{5-10}$ aromatic group; and an anode comprising a second conducting layer, wherein said anode is transparent to light generated by said electroluminescent layer.

2. The OLED of claim 1 wherein X is —O— in each occurrence.

3. The OLED of claim 2 wherein each R$_1$ is dimethylamino or diphenylamino.

4. The OLED of claim 3 wherein each Ar$_1$ is 1,4-phenylene or 1,3-phenylene.

5. The OLED of claim 4 wherein each R$_2$ is H.

6. The OLED of claim 5 wherein each R$_3$ is a C$_{1-20}$ alkyl, alkoxy, aryl, aryloxy, alkoxyaryl, or alkylcarbonyloxy group.

7. The OLED of claim 1 wherein X is —N(R$_5$) in each occurrence.

8. The OLED of claim 7 wherein each R$_1$ is dimethylamino or diphenylamino.

9. The OLED of claim 8 wherein each Ar$_1$ is 1,4-phenylene.

10. The OLED of claim 9 wherein each R$_2$ is H.

11. OLED of claim 10 wherein each R$_3$ is a C$_{1-20}$ alkyl, alkoxy, aryl, aryloxy, alkoxyaryl, or alkylcarbonyloxy group.

12. The OLED of claim 1 wherein X is —S in each occurrence.

13. The OLED of claim 12 wherein each R$_1$ is dimethylamino or diphenylamino.

14. The OLED of claim 13 wherein each Ar$_1$ is 1,4-phenylene or 1,3-phenylene.

15. The OLED of claim 14 wherein each R$_2$ is H.

16. The OLED of claim 15 wherein each R$_3$ is a C$_{1-20}$ alkyl, alkoxy, aryl, aryloxy, alkoxyaryl, or alkylcarbonyloxy group.

17. The OLED of claim 1 wherein said cathode comprises Mg.

18. The OLED of claim 1 wherein said cathode comprises an alloy of Mg, Al.

19. The OLED of claim 1 wherein said cathode comprises an alloy of Mg and Ag.

20. The OLED of claim 1 wherein said cathode comprises an alloy of Li and Al.

21. The OLED of claim 1 further comprising an electron transport layer, said electron transport layer being sandwiched between said cathode and said electroluminescent layer, said electron transport layer comprising a compound having an energy band intermediate between that of said cathode and that of said electroluminescent layer.

22. The OLED of claim 21 wherein said electron transport layer comprises a metal chelated oxinoid compound.

23. The OLED of claim 21 further comprising a hole transport layer, said hole transport layer being sandwiched between said electroluminescent layer and said anode, said hole transport layer comprising a compound having an energy band intermediate between that of said anode and that of said electroluminescent layer.

24. The OLED of claim 23 wherein the hole transport compound is an aromatic tertiary amine.

25. The OLED of claim 23 wherein said hole transport layer comprises

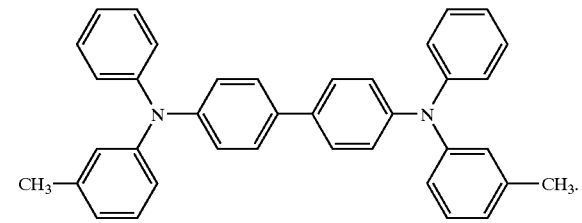

26. The OLED of claim 23 wherein said hole transport layer comprises

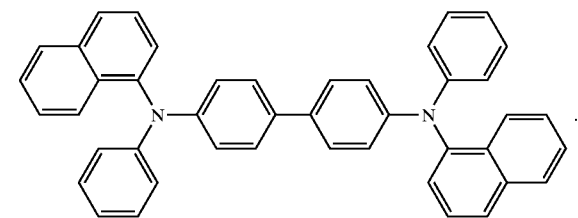

27. An OLED comprising a cathode comprising a first conducting layer;

an electroluminescent layer comprising a compound having the formula

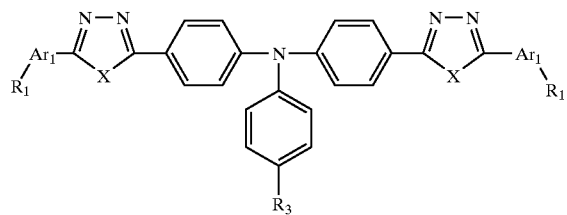

wherein X is independently in each occurrence —O—, —S—, or N(R$_5$), wherein R$_5$ is a C$_{1-20}$ hydrocarbyl (which correspond to the heterocyclic group being a 1,3,4 oxadiazole, 1,3,4-thiadiazole or 1,2,4,-triazole, respectively); R$_1$ is independently in each occurrence C$_{1-20}$ alkyl, alkoxy, aryl, aryloxy, or a tertiary amine group —N(R$_4$)$_2$, wherein R$_4$ is a C$_{1-20}$ hydrocarbyl group which is optionally substituted with C$_{1-20}$ alkoxy groups R$_3$ is independently in each occurrence a C$_{1-20}$ alkyl, or alkoxy group; and Ar$_1$ is independently in each occurrence a divalent C$_{5-10}$ aromatic group; and an anode comprising a second conducting layer, wherein said anode is transparent to light generated by said electroluminescent layer.

28. The OLED of the claim 27 wherein X is —O—, Ar$_1$ is 1,3-phenylene, R$_1$ is methoxy, and R$_3$ is methyl in each occurrence.

* * * * *